United States Patent
Shimomura

(10) Patent No.: US 7,754,620 B2
(45) Date of Patent: Jul. 13, 2010

(54) FILM FORMATION METHOD AND RECORDING MEDIUM

(75) Inventor: Kouji Shimomura, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 643 days.

(21) Appl. No.: 11/391,246

(22) Filed: Mar. 29, 2006

(65) Prior Publication Data

US 2006/0223338 A1  Oct. 5, 2006

(30) Foreign Application Priority Data

Mar. 30, 2005  (JP) .............................. 2005-098620

(51) Int. Cl.
*H01L 21/469* (2006.01)

(52) U.S. Cl. ................. 438/785; 257/E21.274

(58) Field of Classification Search ............... 438/623, 438/785, 787; 257/E21.269, E21.268, E21.274
See application file for complete search history.

(56) References Cited

U.S. PATENT DOCUMENTS

| 6,586,349 | B1* | 7/2003 | Jeon et al. .................... 438/785 |
| 7,084,080 | B2* | 8/2006 | Borovik et al. ............... 438/794 |
| 7,091,135 | B2* | 8/2006 | Inumiya et al. ............... 438/758 |
| 7,105,362 | B2* | 9/2006 | Takahashi et al. ............. 438/3 |
| 2002/0164421 | A1* | 11/2002 | Chiang et al. ............ 427/248.1 |
| 2003/0219972 | A1* | 11/2003 | Green et al. ................. 438/623 |
| 2003/0232501 | A1* | 12/2003 | Kher et al. ................... 438/689 |
| 2003/0236001 | A1* | 12/2003 | Shinriki et al. ............... 438/785 |
| 2004/0262642 | A1* | 12/2004 | Shimamoto et al. .......... 257/202 |
| 2005/0056219 | A1* | 3/2005 | Dip et al. ....................... 118/722 |
| 2005/0255711 | A1 | 11/2005 | Sugawara et al. |
| 2005/0260357 | A1* | 11/2005 | Olsen et al. ................... 427/569 |
| 2005/0282400 | A1* | 12/2005 | Xiao et al. .................... 438/778 |
| 2006/0008969 | A1* | 1/2006 | Takahashi et al. ............ 438/216 |
| 2006/0062917 | A1* | 3/2006 | Muthukrishnan et al. 427/248.1 |
| 2006/0261389 | A1* | 11/2006 | Vaartstra ....................... 257/295 |
| 2006/0264067 | A1* | 11/2006 | Kher et al. .................... 438/785 |

FOREIGN PATENT DOCUMENTS

| JP | 2002-164586 | 6/2002 |
| JP | 2003-297814 | 10/2003 |
| JP | 2004-22991 | 1/2004 |
| JP | WO 2004/107451 | 9/2004 |
| JP | 2004-303894 | 10/2004 |
| WO | WO 03/088341 A1 | 10/2003 |

* cited by examiner

*Primary Examiner*—W. David Coleman
*Assistant Examiner*—Latanya Crawford
(74) *Attorney, Agent, or Firm*—Oblon, Spivak, McClelland, Maier & Neustadt, L.L.P.

(57) ABSTRACT

A method of forming a metal silicate film on a silicon substrate in a processing container is disclosed that includes the steps of (a) forming a base oxide film on the silicon substrate by feeding an oxidation gas into the processing container; and (b) forming the metal silicate film on the base oxide film by continuing to feed the oxidation gas and by feeding a first gaseous phase material formed of an amidic organic hafnium compound and a second gaseous phase material formed of a silicon-containing material into the processing container.

16 Claims, 6 Drawing Sheets

| | EX1 | EX2 | EX3 |
|---|---|---|---|
| EOT [nm] | 1.48 | 1.49 | 1.45 |
| HfSiO [nm] | 2.10 | 2.05 | 2.12 |
| Si/(Hf+Si) [%] | 60 | 60 | 60 |
| I/L [nm] | 1.10 | 0.80 | 0.76 |

FILM FORMATION METHOD AND RECORDING MEDIUM

BACKGROUND OF THE INVENTION

1. Field of the Invention

The present invention relates generally to methods of forming a metal silicate film used in a semiconductor device, and more particularly to a method of manufacturing a minute high-speed semiconductor device having a high-dielectric-constant film.

2. Description of the Related Art

In today's very high speed semiconductor devices, it is becoming possible to achieve a gate length of 0.1 μm or less with progress in miniaturization processes. In general, the more miniaturized a semiconductor device, the higher its operating speed. In such very minute semiconductor devices, however, a decrease in the gate length due to miniaturization requires the film thickness of a gate insulating film to be reduced in accordance with a scaling law.

However, the gate length of 0.1 μm or less requires the gate insulating film to be 1-2 nm or less in thickness if a conventional thermal oxide film is used for the gate insulating film. Such a very thin gate insulating film causes tunneling current to increase, and the problem of a resulting increase in gate leakage current is inevitable.

Such being the case, it has been proposed to apply high-dielectric-constant materials (so-called high-K materials) to the gate insulating film, such as $Ta_2O_5$, $Al_2O_3$, $ZrO_2$, $HfO_2$, $ZrSiO_x$, and $HfSiO_x$, which have much higher dielectric constants than the thermal oxide film. Employment of such high-dielectric-constant materials makes it possible to increase physical film thickness while keeping EOT (Equivalent Oxide Thickness) small (EOT shows the thickness of a $SiO_2$ film having the same specific capacitance as the high-dielectric-constant film in question). Accordingly, even in a very high speed semiconductor device having an extremely small gate length of 0.1 μm or less, it is possible to employ a gate insulating film of approximately 10 nm in physical film thickness, so that it is possible to suppress gate leakage current due to the tunnel effect.

In particular, metal silicate materials such as $ZrSiO_x$ and $HfSiO_x$ have significantly high crystallization temperatures compared with oxide materials such as $ZrO_2$ and $HfO_2$ although their dielectric constants are slightly lower than those of the oxide materials. Accordingly, it is possible to control occurrence of crystallization in a film effectively even in the case of performing heat treatment employed in a semiconductor device manufacturing process. Therefore, the metal silicate materials are considered extremely suitable for the high-dielectric-constant gate insulating film of the high-speed semiconductor device. Further, it is conventionally performed to introduce nitrogen into a high-dielectric-constant film in order to control crystallization and to prevent diffusion of a dopant having a high diffusion coefficient, such as B, in particular, from a gate electrode into a channel region. In the case of causing an increase in crystallization temperature by introducing nitrogen, it is preferable that nitrogen atoms be bonded to Si atoms in the high-dielectric-constant gate insulating film, which is accordingly required to contain a sufficient amount of Si atoms.

Conventionally, it is known that such a high-dielectric-constant gate insulating film can be formed by Atomic Layer Deposition (ALD) or metalorganic CVD (MOCVD). In particular, in the case of employing ALD, by which a film is formed by depositing atomic layers one by one, it is possible to form any composition gradient in the film. On the other hand, however, ALD is time-consuming because the material gas is switched every atomic layer and a purging process is performed between depositions of atomic layers. Accordingly, ALD has the problem of reduced throughput of manufacturing semiconductor devices.

On the other hand, according to MOCVD, deposition is performed one time using an organometallic compound material. Accordingly, it is possible to achieve significant improvement of the throughput of manufacturing semiconductor devices. Therefore, it is preferred to employ MOCVD rather than ALD in order to improve productivity. Further, a film formation apparatus using MOCVD is simpler in structure than a film formation apparatus using ALD. Accordingly, the MOCVD apparatus enjoys the advantage of reduced apparatus cost and reduced apparatus maintenance cost compared with the ALD apparatus.

Next, a description is given below of a high-speed semiconductor device including a high-dielectric-constant film formed by MOCVD. FIG. 1 is a schematic diagram showing a high-speed semiconductor device 10 having a high-dielectric-constant gate insulating film.

Referring to FIG. 1, the semiconductor device 10 is formed on a silicon substrate 11. A high-dielectric-constant gate insulating film 13 such as $HfSiO_x$ is formed on the silicon substrate 11 with a thin base oxide film 12 provided therebetween. Further, a gate electrode 14 is formed on the high-dielectric-constant gate insulating film 13.

According to the semiconductor device 10 of FIG. 1, an oxynitride film 12A is formed by doping the surface part of the base oxide film 12 with such a level of nitrogen (N) as to maintain the flatness of the interface between the silicon substrate 11 and the base oxide film 12. The EOT of the base oxide film 12 is further reduced by forming the oxynitride film 12A having a higher dielectric constant than a silicon oxide film in the base oxide film 12.

As described above, in actual semiconductor devices, an extremely thin base oxide film (silicon oxide film, $SiO_2$) is provided between a high-dielectric-constant insulating film and a silicon substrate in order to improve carrier mobility in a channel region. In using the base oxide film, nitrogen is added thereto if necessary.

In this case, the base oxide film is required to be extremely thin. If the base oxide film is thick, the effective EOT increases even in combination with the high-dielectric-constant insulating film formed thereon, thus canceling the effect produced by using the high-dielectric-constant insulating film for a gate insulating film. Meanwhile, such an extremely thin base oxide film is required to evenly cover the surface of the silicon substrate and not to form a defect such as an interface state.

For example, it has been proposed to form the above-described base oxide film after forming a metal silicate film in the case of forming the metal silicate film as a high-dielectric-constant gate insulating film by MOCVD using an amidic organic material (see, for example, PCT International Application Publication No. WO 03/088341).

For example, in the case of forming a metal silicate film by MOCVD using an amidic organic material, it is preferable to provide the process of removing excess carbon (C) in the metal silicate film by performing plasma processing after forming the metal silicate film. Therefore, there has been proposed the method of forming a base oxide film by oxidizing the surface of a silicon substrate through the metal silicate film using plasma processing.

Even in the case of forming a base oxide film by the above-described method, however, there is a problem in that the effects of the film quality and film thickness of a film formed in the beginning of film formation by MOCVD using a high-dielectric-constant material are not taken into consideration.

As described above, the base oxide film is very thin, and preferably, is formed to be, for example, 0.8 nm or less in thickness. Therefore, there may be a case where the film quality of a film in an extremely thin region formed in the beginning of film formation in forming a metal silicate film by MOCVD becomes important. Conventionally, little consideration is given of such film quality and film thickness in the beginning of film formation. In the case of MOCVD in particular, there may be a difference between the film quality of an extremely thin region formed in the beginning of film formation and the film quality at the later stage in the film formation. If the film quality thus changes in the vicinity of the interface between the base oxide film and the metal silicate film, there is a problem in that film qualities such as a dielectric constant and EOT deviate from desired values.

For example, even if the base oxide film is formed to be very thin with excellent film quality, because of the effects of changes in the film quality of a high-dielectric-constant silicate film in the beginning of its formation by MOCVD, desired electrical characteristics may not be obtained when a device is formed.

In particular, in the case of using an amidic material gas containing no oxygen in its material composition, the degree of oxidation of the material gas differs depending on the state of feeding of the material gas and an oxidation gas onto the silicon substrate. Accordingly, the film quality may differ greatly, and there is a problem in that there is great variation in the film quality in the beginning of film formation in particular.

SUMMARY OF THE INVENTION

According to one embodiment of the present invention, there are provided a film formation method in which the above-described disadvantage is eliminated and a recording medium storing the film formation method.

According to one embodiment of the present invention, there are provided a film formation method that provides a film formed between a silicon substrate and a metal silicate film with excellent thickness and quality in the case of forming the metal silicate film on the silicon substrate, and a recording medium storing the film formation method.

According to one embodiment of the present invention, there is provided a method of forming a metal silicate film on a silicon substrate in a processing container, the method including the steps of (a) forming a base oxide film on the silicon substrate by feeding an oxidation gas into the processing container; and (b) forming the metal silicate film on the base oxide film by continuing to feed the oxidation gas and by feeding a first gaseous phase material formed of an amidic organic hafnium compound and a second gaseous phase material formed of a silicon-containing material into the processing container.

According to one embodiment of the present invention, there is provided a computer-readable recording medium storing a program for causing a computer to execute a film formation method by a film formation apparatus including a processing container retaining a silicon substrate therein, an oxidation gas feed part to feed an oxidation gas into the processing container, and a material gas feed part to feed a first gaseous phase material formed of an amidic organic hafnium compound and a second gaseous phase material formed of a silicon-containing material into the processing container, the film formation method including the steps of (a) forming a base oxide film on the silicon substrate by feeding the oxidation gas into the processing container; and (b) forming a metal silicate film on the base oxide film by continuing to feed the oxidation gas and by feeding the first gaseous phase material and the second gaseous phase material into the processing container.

According to one aspect of the present invention, it is possible to provide a film formation method that provides a film formed between a silicon substrate and a metal silicate film with excellent thickness and quality in the case of forming the metal silicate film on the silicon substrate.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

According to the present invention, a first gaseous phase material formed of an amidic organic hafnium compound and a second gaseous phase material formed of a silicon-containing material are fed into a processing container in which a silicon substrate is processed, and a metal silicate film is formed on the silicon substrate. In this case, film quality in the beginning (initial stage) of film formation (immediately after the start of film formation) is actively controlled.

Figure 1:
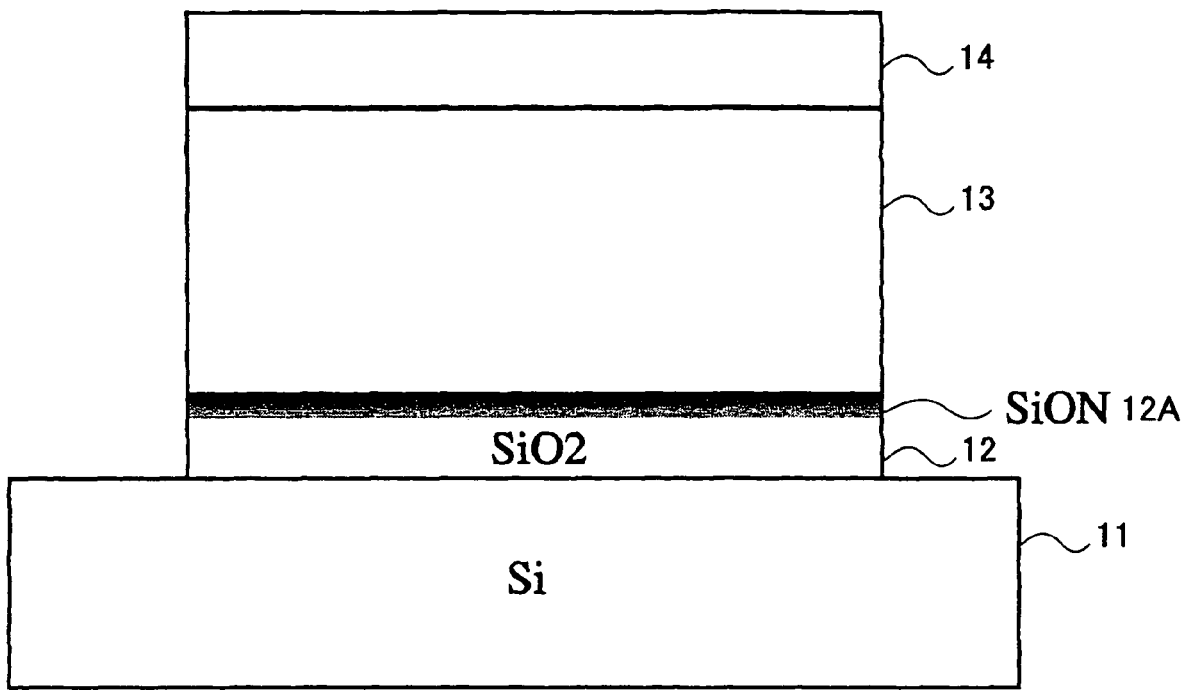
FIG. 1 is a schematic diagram showing a semiconductor device having a high-dielectric-constant gate insulating film.
Figure 2:
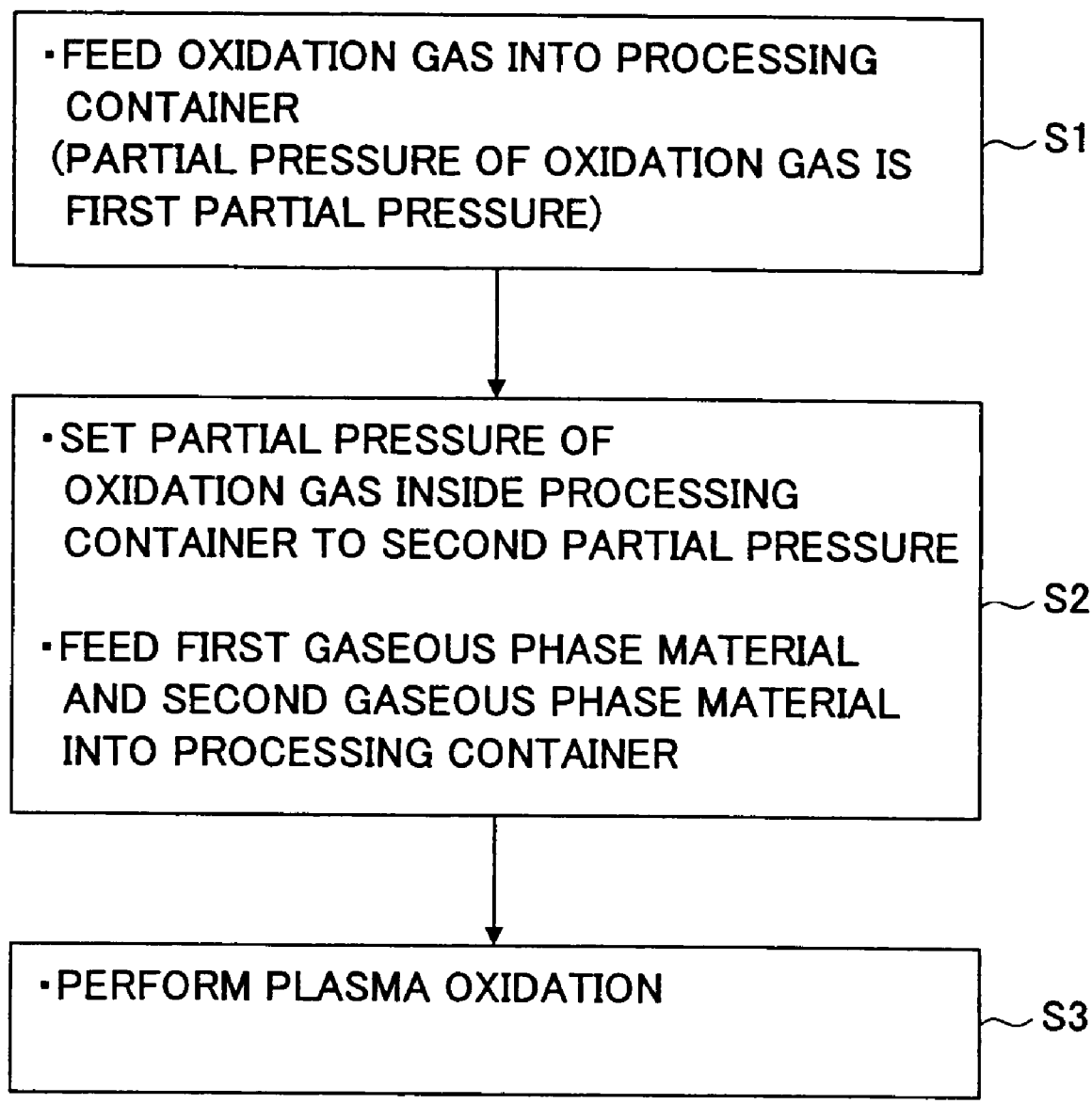
FIG. 2 is a flowchart showing an overview of a film formation method according to the present invention.

FIG. 2 is a flowchart showing an overview of a film formation method according to the present invention. Referring to FIG. 2, according to a film formation method according to the present invention, first, in step S1, an oxidation gas is fed into a processing container in which a silicon substrate on which a film is to be formed is retained, thereby forming a base oxide film on the silicon substrate.

Next, in step S2, while the feeding of the oxidation gas of step S1 is continued, a first gaseous phase material formed of an amidic organic hafnium compound and a second gaseous phase material formed of a silicon-containing material are fed into the processing container, so that a metal silicate film is formed on the base oxide film.

Thereafter, if necessary, it is suitable to perform plasma processing on the metal silicate film in step S3 in order to improve the quality of the metal silicate film.

According to the present invention, when film formation is started, first, a base oxide film is actively formed on a silicon substrate before forming a metal silicate film, and then the metal silicate film is successively formed on the base oxide film.

In particular, in the case of CVD using a gaseous phase material gas and an oxidation gas to oxidize the gaseous phase material gas, it is preferable, for stabilization of film quality, to employ a method of forming a film by feeding the oxidation gas into a processing container and feeding the gaseous phase material gas after the partial pressure (flow rate) of the oxidation gas is stabilized.

The present invention achieves good controllability of the film quality and film thickness of a film formed between a silicon substrate and a metal silicate film, such as a base oxide film, and a film formed in the vicinity of the interface between the base oxide film and the metal silicate film. Accordingly, the controllability of the effective dielectric constant and EOT of the entire gate insulating film including the base oxide film and the film formed in the vicinity of the interface between the base oxide film and the metal silicate film becomes excellent.

Further, the above-described method is particularly effective in the case of using an amidic material gas containing no oxygen in its material composition. For example, in the case of using an amidic material (such as amidic organic hafnium compound, an amidic organic silicon compound, etc.), the method of actively controlling film quality at the boundary between the silicon substrate and the metal silicate film is effective for stabilization of the film quality because the degree of oxidation of the material gas differs depending on the state of feeding the material gas and the oxidation gas onto the silicon substrate.

Next, a description is given, with reference to the accompanying drawings, of an embodiment of the present invention.

Figure 3:
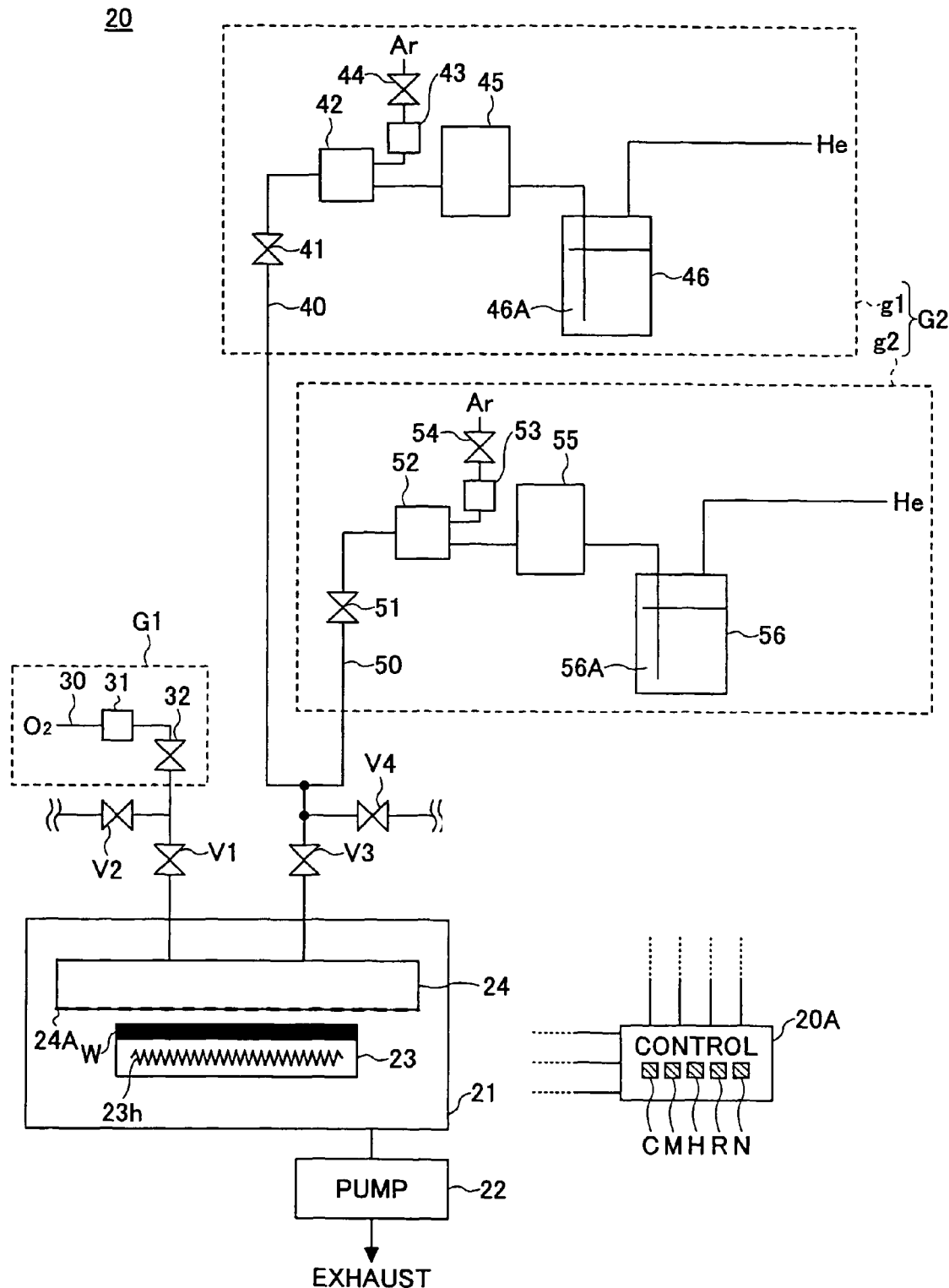
FIG. 3 is diagram showing a film formation apparatus capable of implementing a film formation method according to an embodiment of the present invention.

FIG. 3 is diagram showing a film formation apparatus 20 for implementing a film formation method according to the embodiment of the present invention. Referring to FIG. 3, the film formation apparatus 20 includes a processing container 21, which is evacuated by a pump 22. A holding table 23 for holding a silicon substrate W is provided in the processing container 21. The holding table 23 has a built-in heater 23$h$.

In the processing container 21, a shower head 24 from which an oxidation gas or gaseous phase material gas described below is fed is further provided so as to oppose the silicon substrate W. The oxidation gas or the gaseous phase material gas fed to the shower head 24 is fed onto the silicon substrate W through multiple gas ejection holes 24A formed on the surface of the shower head 24 opposing the silicon substrate W.

An oxidation gas feed part G1 feeding the oxidation gas to the shower head 24 is connected to the shower head 24 through a valve V1. The oxidation gas feed part G1 includes a gas line 30, a mass flow rate controller 31, and a valve 32. The gas line 20 is connected to the source of the oxidation gas such as oxygen (not graphically illustrated). The mass flow rate controller 31 and the valve 32 are provided in the gas line 30. By opening the valve 32 and the valve V1, the oxidation gas whose flow rate has been controlled by the mass flow rate controller 32 is fed through the shower head 24 onto the silicon substrate W in the processing container 21.

A material gas feed part G2 feeding the gaseous phase material gas to the shower head 24 is connected to the shower head 24 through a valve V3.

The material gas feed part G2 includes a first material gas feed part g1 feeding a first gaseous phase material (gas) to the shower head 24 and a second material gas feed part g2 feeding a second gaseous phase material (gas) to the shower head 24.

The material gas feed part g1 includes a container 46 retaining a material 46A, which is an amidic organic hafnium compound such as tetrakis(diethylamino)hafnium. The material 46A in the container 46 is transported by a pressure gas such as He gas to a vaporizer 42 through a liquid mass flow rate controller 45. A gas source of a carrier gas such as Ar (not graphically illustrated) is connected to the vaporizer 42 through a valve 44 and a mass flow rate controller 43. The material 46A fed to the vaporizer 42 is vaporized into the first gaseous phase material with the assistance of the carrier gas such as Ar, and flows through a gas line 40 to be fed from a valve 41 to the shower head 24 through the valve V3.

Further, the material gas feed part g2 includes a container 56 retaining a material 56A, which is an amidic organic silicon compound that is a silicon-containing material such as tetrakis(dimethylamino)silane. The material 56A in the container 56 is transported by a pressure gas such as He gas to a vaporizer 52 through a liquid mass flow rate controller 55. A gas source of a carrier gas such as Ar (not graphically illustrated) is connected to the vaporizer 52 through a valve 54 and a mass flow rate controller 53. The material 56A fed to the vaporizer 52 is vaporized into the second gaseous phase material with the assistance of the carrier gas such as Ar, and flows through a gas line 50 to be fed from a valve 51 to the shower head 24 through the valve V3.

In the shower head 24, the oxidation gas, the first gaseous phase material, and the second gaseous phase material goes through their respective channels to be discharged into a processing space in the processing container 21 from the gas ejection holes 24A formed on the surface of the shower head 24 opposing the silicon substrate W.

Further, it is also possible to discharge the oxidation gas fed from the oxidation gas feed part G1 to a gas exhaust line (not graphically illustrated) by closing the valve V1 and opening a valve V2.

Likewise, it is also possible to discharge the first gaseous phase material and the second gaseous phase material fed from the material gas feed part G2 to a gas exhaust line (not graphically illustrated) by closing the valve V3 and opening a valve V4.

Further, the film formation apparatus 20 includes a control part 20A having a built-in computer. The control part 20A controls the operations of the film formation apparatus 20 related to substrate processing such as film formation. The control part 20A includes a recording medium storing a program for causing the film formation apparatus to operate, such as a film formation method. Based on the program, the computer causes the operations of the film formation apparatus 20 to be executed. This program may also be referred to as "recipe."

For example, the control part 20A includes a CPU (computer) C, a memory M, a recording medium H such as a hard disk, a removable recording medium R, and a network connection part N, which are connected via a bus (not graphically illustrated). The bus is connected to, for example, the above-described valves, pump, and mass flow rate controllers of the film formation apparatus 20. The recording medium H stores the program for causing the film formation apparatus 20 to operate. Alternatively, the program may be input through, for example, the recording medium R or the network connection part N. According to a film formation method shown below, the film formation apparatus 20 operates, being controlled based on the program stored in the control part 20A.

Figure 4:
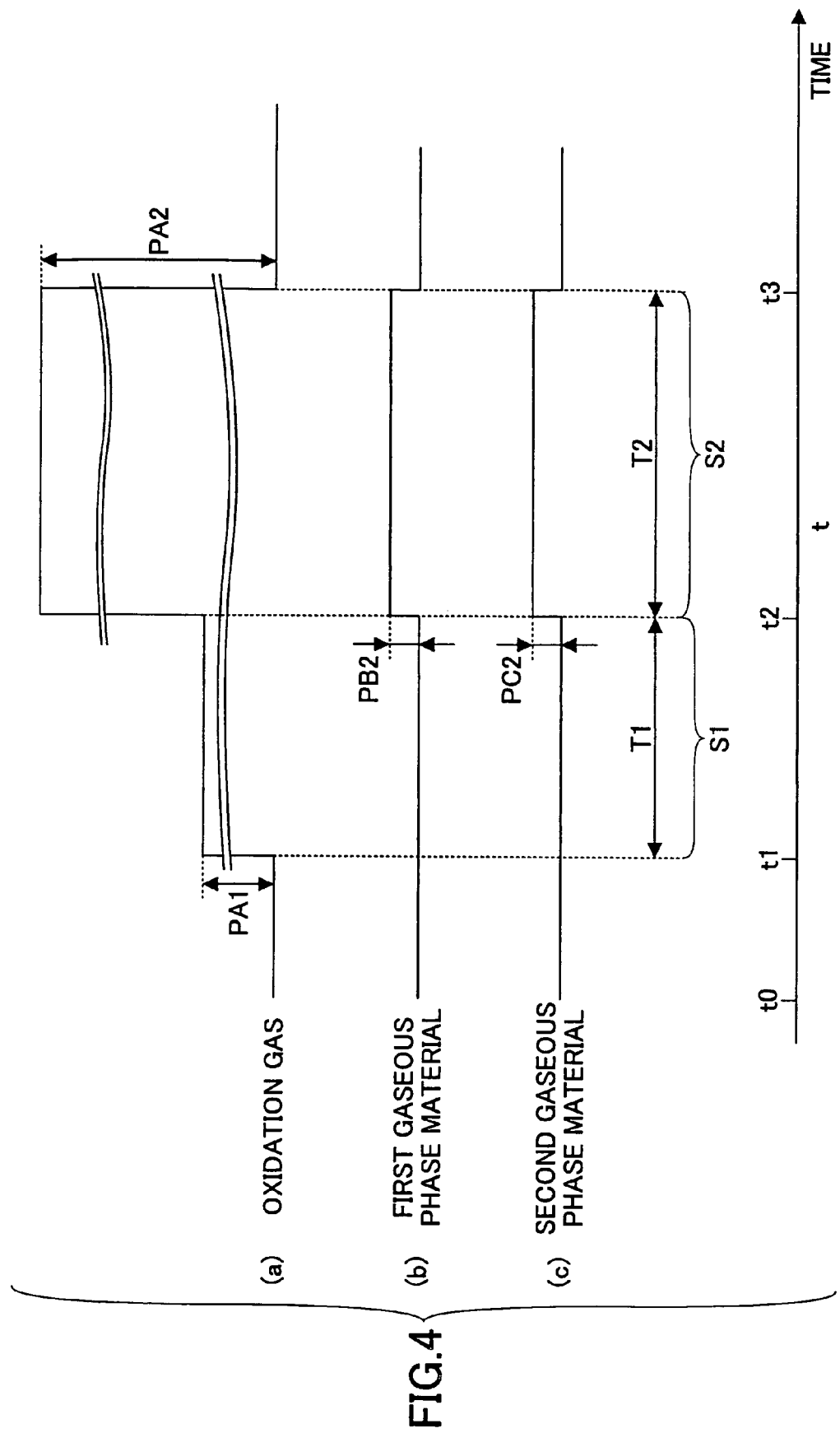
FIG. 4 is a time chart showing the film formation method according to the embodiment of the present invention.

Next, FIG. 4 is a time chart showing a film formation method according to this embodiment. In the time chart of FIG. 4, (a) indicates changes over time in the partial pressure of the oxidation gas in the processing container 21, (b) indicates changes over time in the partial pressure of the first gaseous phase material, and (c) indicates changes over time in the partial pressure of the second gaseous phase material. In the time chart of FIG. 4, S1 and S2 correspond to step S1 and step S2, respectively, of the flowchart of the film formation method shown in FIG. 2.

Referring to FIG. 4, first, at Time t0, when the silicon substrate W is placed on the holding table 23 and film-formation is started, the temperature of the silicon substrate W is increased by the heater 23h housed in the holding table 23. At this point, an inert gas such as Ar may be fed into the processing container 21.

Next, at Time t1, step S1 is started. Before starting step S1, it is preferable to stabilize the flow rate of the oxidation gas by opening the valve 32 and the valve V2 and discharging the oxidation gas whose flow rate has been controlled by the mass flow rate controller 31 to the gas exhaust line in advance. In this case, at the same time that step S1 is started, the valve V2 is closed and the valve 1 is opened. As a result, the oxidation gas (oxygen) of a stable flow rate is fed from the shower head 24 into the processing container 21, so that the partial pressure of the oxidation gas in the processing container 21 is a partial pressure PA1 shown in FIG. 4.

In this case, the partial pressure of the oxidation gas is controlled by, for example, the flow rate of the oxidation gas (the mass flow rate controller 31). At this point, the surface of the silicon substrate W is oxidized, so that a base oxide film is formed on the silicon substrate W.

Next, after passage of a predetermined period of time T1, at Time t2, step S2 is started following step S1. In step S2, the flow rate of the oxidation gas is increased by the mass flow rate controller 31, so that the oxygen partial pressure in the processing container 21 increases from the partial pressure PA1 in step S1 to a partial pressure PA2.

Further, in this step, the valve V3 is opened so that the first gaseous phase material and the second gaseous phase material are fed with carrier gases from the material gas feed part G2 into the processing container 21 through the shower head 24.

In this case, before starting step S2, it is preferable that the gas feed part g1 be controlled as follows. First, it is preferable to open the valves 41 and 44 and the valve V4 prior to the start of step S2. At this point, the material 46A whose flow rate has been controlled by the liquid mass flow rate controller 45 and the carrier gas whose flow rate has been controlled by the mass flow rate controller 43 are fed to the vaporizer 42. The material 46A is vaporized into the first gaseous phase material with the assistance of the carrier gas in the vaporizer 42, and is discharged from the gas exhaust line together with the carrier gas. It is preferable to thus provide a time for discharging a certain amount of the first gaseous phase material to the gas discharge line, thereby stabilizing the flow rate of the first gaseous phase material.

Likewise, it is preferable to open the valves 51 and 54 and the valve V4 prior to the start of step S2. At this point, the material 56A whose flow rate has been controlled by the liquid mass flow rate controller 55 and the carrier gas whose flow rate has been controlled by the mass flow rate controller 53 are fed to the vaporizer 52. The material 56A is vaporized into the first gaseous phase material with the assistance of the carrier gas in the vaporizer 52, and is discharged from the gas exhaust line together with the carrier gas. It is preferable to thus provide a time for discharging a certain amount of the second gaseous phase material to the gas discharge line, thereby stabilizing the flow rate of the second gaseous phase material.

In this case, when step S2 is started, the valve V4 is closed and the valve V3 is opened, so that the first gaseous phase material and the second gaseous phase material are fed from the shower head 24 into the processing container 21. The partial pressure of the first gaseous phase material is controlled to be a partial pressure PB2, and the partial pressure of the second gaseous phase material is controlled to be a partial pressure PC2.

In this step, the flow rate of the oxidation gas, the flow rate of each carrier gas, and the flow rate of each of the first and second gaseous phase materials are controlled, so that their respective partial pressures in the processing container 21 are controlled.

Next, after passage of a predetermined period of time T2, at Time t3, feeding of the oxidation gas, the first gaseous phase material, and the second gaseous phase material into the processing container 21 is stopped, and the film formation ends.

Thereafter, as shown in step S3 of FIG. 2, it is suitable to improve the quality of the metal silicate film by performing plasma processing on the metal silicate film separately. In this case, it is suitable to perform this plasma processing using, for example, a high-density plasma of low electron temperature. Further, it is suitable to perform this plasma processing using, for example, a microwave plasma processing apparatus. The plasma processing accelerates oxidation of the metal silicate film, thus making it possible to reduce excess carbon (C) in the metal silicate film. Therefore, the metal silicate film can be higher in dielectric constant than before the plasma processing.

Further, according to the above-described film formation method, since it is preferable to form as thin a base oxide film as possible, it is preferable to make the partial pressure PA1 as low as possible. However, if the oxygen partial pressure is too low in step S1, film formation may occur with insufficient oxygen immediately after the first gaseous phase material gas and the second gaseous phase material gas are fed into the processing container 21 on entry into step S2, so that a film with insufficient oxygen, that is, a film having a low dielectric constant because of a large amount of residual carbon, may be formed in the vicinity of the interface between the base oxide film and the metal silicate film in particular. Therefore, it is preferable that the partial pressure PA1 be higher than or equal to a predetermined value.

Further, it is preferable that the partial pressure PA2 be controlled so as to be higher than the partial pressure PA1. This is for preventing degradation of the film quality (reduction in dielectric constant due to residual carbon) of the metal silicate film by forming as thin a base oxide film as possible in step S1 and feeding sufficient oxygen for the first gaseous phase material gas and the second gaseous phase material gas in step S2.

Next, a detailed description is given, based on the following experimental results, of preferred values of these partial pressures in the processing container 21. In the following experiments, oxygen is used for the oxidation gas, tetrakis(diethylamino)hafnium is used for the material 46A (first gaseous phase material), tetrakis(dimethylamino)silane is used for the material 56A (second gaseous phase material), and Ar is used as a carrier gas in performing the above-described film formation method.

Figure 5:
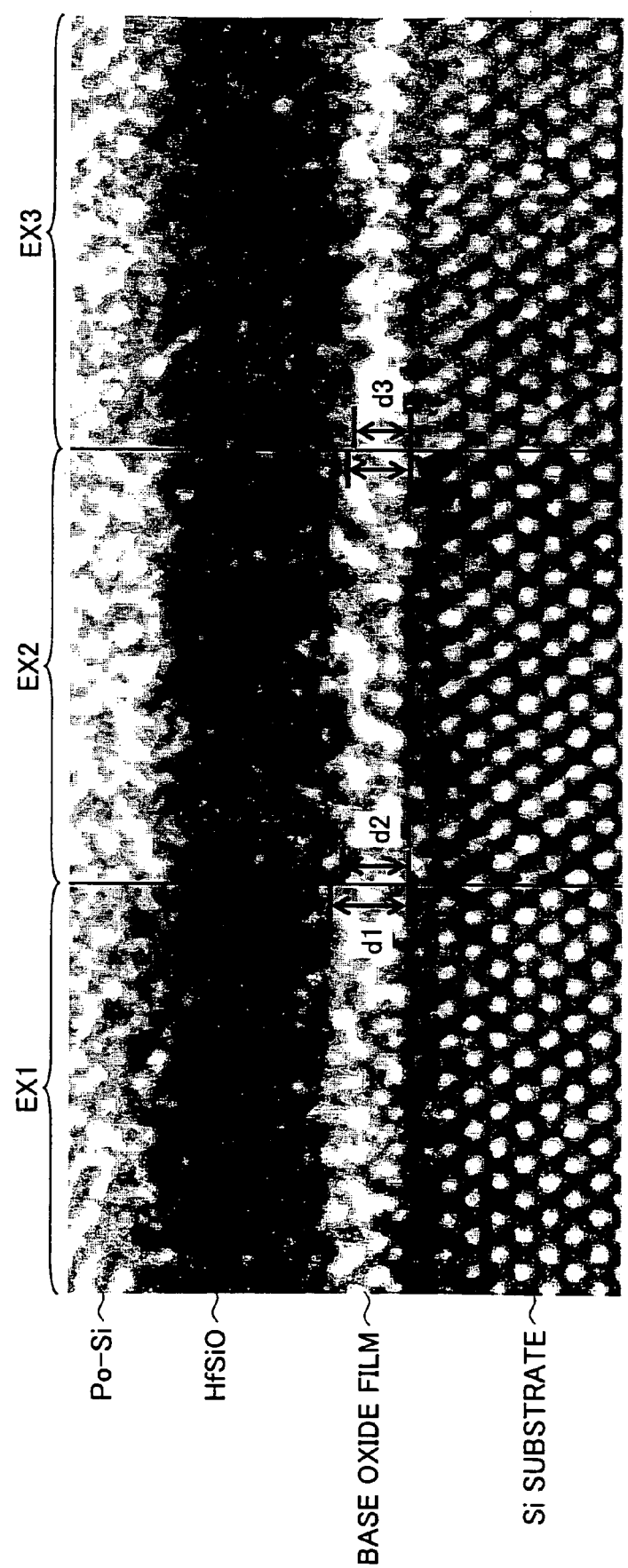
FIG. 5 shows SEM photographs showing the results of film formation with the film formation apparatus according to the embodiment of the present invention.

FIG. 5 shows the SEM (Scanning Electron Microscope) photographs of cross sections of multilayer structures in the case of forming a base oxide film and a hafnium silicate film on a silicon substrate using the above-described film formation method, and separately forming a polysilicon film on the hafnium silicate film. FIG. 5 shows the SEM photographs of Experiments EX1, EX2, and EX3, which are different in film formation conditions from one another.

Figures 6, 7:
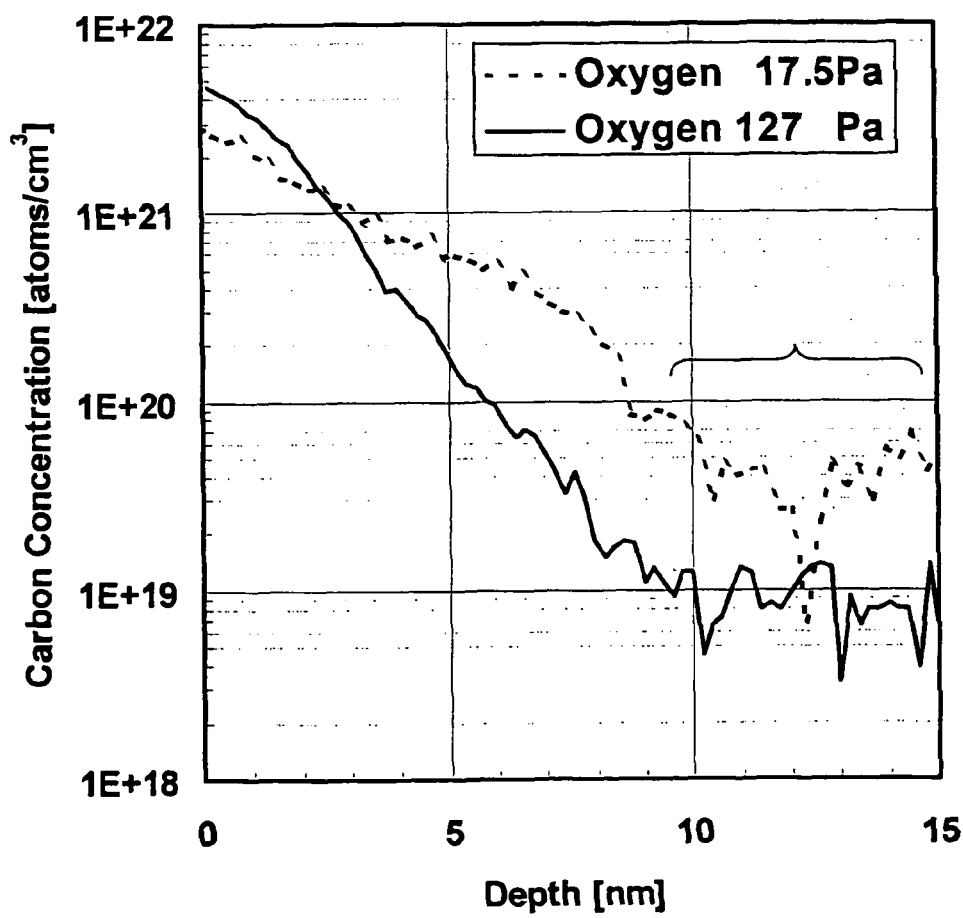
FIG. 6 is a table showing the results of the film formation with the film formation apparatus according to the embodiment of the present invention.
FIG. 7 is a graph showing the results of analysis of hafnium silicate films formed with the film formation apparatus according to the embodiment of the present invention.

FIG. 6 shows the effective EOT of a combination of the base oxide film and a high-dielectric-constant film, the thickness of the hafnium silicate (HfSiO$_x$) film, the Si content in the hafnium silicate film, and the thickness of the base oxide film (I/L) for each of Experiments EX1, EX2, and EX3. The EOT is of a combination film of the base oxide film and the hafnium silicate film. In this case, lower EOT values are preferable in the case of using the combination film as the gate insulating film of a high-speed transistor.

Further, in each of Experiments EX1, EX2, and EX3, in the case of performing the film formation method shown in FIGS. 2 and 4, film formation is performed maintaining the partial pressure PA1 of the oxidation gas in step S2 without an increase in the partial pressure of the oxidation gas between step S1 and step S2 in order to facilitate analysis of the experimental results. That is, in the above-described experiments, it is considered that a thick film close in quality to a film expected to be formed in the vicinity according to the above-described film formation method (in which the oxygen partial pressure is increased in step S2) is formed on the base oxide film.

For example, in the case of Experiment EX1, the total pressure in the processing container 21 is 280 Pa, the partial pressure PA1 of oxygen in step S1 is 125 Pa, the partial pressure PB2 of the first gaseous phase material and the partial pressure PC2 of the second gaseous phase material in step S2 are 0.0424 Pa and 0.044 Pa, respectively, and step S1 is performed for 120 sec.

Referring to FIGS. 5 and 6, for example, in the case of Experiment EX1, EOT is 1.48 nm, the thickness of the hafnium silicate film is 2.10 nm, the Si content is 60%, and the thickness of the base oxide film (indicated by d1 in FIG. 5) is 1.10 nm.

Further, as described above, it is preferable that the base oxide film be as thin as possible in this case. Therefore, in Experiment EX2, the partial pressure PA1, that is, the partial pressure of oxygen, is reduced to 6.35 Pa. The conditions other than the partial pressure PA1 are the same as in Experiment EX1. In this case, EOT is 1.49 nm, the thickness of the hafnium silicate film is 2.05 nm, the Si content is 60%, and the thickness of the base oxide film (indicated by d2 in FIG. 5) is 0.80 nm.

Thus, in the case of Experiment EX2, the thickness of the base oxide film is reduced from 1.10 nm to 0.80 nm because of reduction in the partial pressure PA1 compared with the case of Experiment EX1.

On the other hand, however, compared with the case of Experiment EX1, the EOT of the combined structure of the base oxide film and the hafnium silicate film increases although the Si content of the hafnium silicate film remains the same and the base oxide film is reduced in thickness in the case of Experiment EX2. This shows reduction in the dielectric constant of the hafnium silicate film. This reduction in the dielectric constant of the hafnium silicate film suggests that too low a partial pressure of oxygen (partial pressure PA1) prevents oxidation of material in the case of forming the metal (hafnium) silicate film, thus causing an increase in the residual amount of carbon in the metal silicate film, the carbon causing a decrease in the dielectric constant of the metal silicate film.

For example, FIG. 7 shows the results of SIMS analysis of hafnium silicate formed under the same conditions as in Experiment EX1 (an oxygen partial pressure of 127 Pa) and hafnium silicate formed under the same conditions as in Experiment EX1 except that only the oxygen partial pressure is changed to 17.5 Pa.

FIG. 7 shows that in the case of the lowered oxygen partial pressure (17.5 Pa), the carbon concentration is high over substantially the entire region in the depth direction compared with the case of the same conditions as in Experiment EX1 (an oxygen partial pressure of 127 Pa). That is, it is clear that in the case of an oxygen partial pressure lower than or equal to a predetermined value, the carbon concentration in the hafnium silicate film increases so that the dielectric constant of the hafnium silicate film is reduced.

This explains the reason why the EOT of the combined structure of the base oxide film and the hafnium silicate film increases although the base oxide film is reduced in thickness in the case of comparing the results of Experiment EX2 with the results of Experiment EX1. That is, EOT is considered to be increased because the decrease in the dielectric constant of the hafnium silicate film contributes to an increase in EOT more than the decrease in the thickness of the base oxide film contributes to a decrease in EOT.

The above-described results show that it is preferable to lower the partial pressure PA1 in order to reduce the thickness of the base oxide film but that it is preferable that the partial pressure PA1 be higher than or equal to a predetermined value in order to prevent a decrease in the dielectric constant of the hafnium silicate film. In this case, the lower limit of the partial pressure PA1 is considered a pressure at which the EOT of the combined structure of the base oxide film and the hafnium silicate film switches from decreasing to increasing in the case of lowering the partial pressure PA1.

For example, in the case of using oxygen for the oxidation gas, tetrakis(diethylamino)hafnium for the material 46A (first gaseous phase material), and tetrakis(dimethylamino)silane for the material 56A (second gaseous phase material), it is known that the above-described EOT increases when the partial pressure PA1 (oxygen-partial pressure of step S1) is lower than 6.35 Pa. Therefore, it is preferable that the partial pressure PA1 be higher than or equal to 6.35 Pa in the above-described case.

Further, in terms of minimizing the EOT of the combined structure of the base oxide film and the hafnium silicate film, it is preferable that the partial pressure PA1 in step S1 be also higher than or equal to a predetermined value with respect to the partial pressure PB2 of the first gaseous phase material and the partial pressure PC2 of the second gaseous phase material in step S2. That is, it is preferable to prevent a carbon concentration in the hafnium silicate film from being high.

In this case, even considering an increase in oxygen partial pressure between step S1 and step S2 in the above-described film formation, it is considered preferable that the oxygen partial pressure of step S1 be higher than or equal to a predetermined value with respect to the partial pressure of the gaseous phase material gas of step S2 in view of the film quality in the vicinity of the interface between the base oxide film and the hafnium silicate film.

For example, in Experiment EX2 described above, the partial pressure PA1 is 73 times the combined value of the partial pressure PB2 and the partial pressure PC2 in step S2. Therefore, considering a margin, the oxygen partial pressure of step S1 is preferably 100 times or more the combined value of the partial pressure of the first gaseous phase material (tetrakis(diethylamino)hafnium) and the partial pressure of the second gaseous phase material (tetrakis(dimethylamino)silane) of step S2 in order to prevent an increase in the EOT of the combined structure of the base oxide film and the hafnium silicate film.

Further, it is preferable, for example, to reduce the time of step S1 in order to further reduce the thickness of the base oxide film and EOT. Experiment EX3 is the case of reducing the time of step S1 (10 seconds). In this case, the thickness of the base oxide film (indicated by d3 in FIG. 5) is further reduced to 0.76 nm, and the EOT of the combined structure of the hafnium silicate film and the base oxide film, which is 1.45, is reduced compared with the case of Experiment EX1 and the case of Experiment EX2.

By further modifying the above-described film formation method in a variety of manners, it is possible to further reduce the EOT of the combined structure of the hafnium silicate film and the base oxide film.

According to one embodiment of the present invention, it is possible to provide a film formation method that provides a film formed between a silicon substrate and a metal silicate film with excellent thickness and quality in the case of forming the metal silicate film on the silicon substrate.

The present invention is not limited to the specifically disclosed embodiment, and variations and modifications may be made without departing from the scope of the present invention.

The present application is based on Japanese Priority Patent Application No. 2005-098620, filed on Mar. 30, 2005, the entire contents of which are hereby incorporated by reference.

What is claimed is:

1. A method of forming a metal silicate film on a silicon substrate in a processing container, the method comprising the steps of:
    (a) forming a base oxide film on the silicon substrate by feeding an oxidation gas into the processing container and oxidizing a surface of the silicon substrate; and
    (b) forming the metal silicate film on the base oxide film by starting feeding a first gaseous phase material formed of an amidic organic hafnium compound and a second gaseous phase material formed of a silicon-containing material simultaneously into the processing container while continuing to feed the oxidation gas,
    wherein a partial pressure of the oxidation gas in the processing container is higher in said step (b) than in said step (a).

2. The method as claimed in claim 1, further comprising the step of:
    (c) performing plasma processing on the metal silicate film after the metal silicate film is formed.

3. The method as claimed in claim 1, wherein the silicon-containing material is an amidic organic silicon compound.

4. The method as claimed in claim 3, wherein:
    the amidic organic hafnium compound is tetrakis(diethylamino)hafnium; and
    the amidic organic silicon compound is tetrakis(dimethylamino)silane.

5. The method as claimed in claim 4, wherein the oxidation gas comprises oxygen.

6. The method as claimed in claim 5, wherein a partial pressure of the oxidation gas in the processing container in said step (a) is higher than or equal to 6.35 Pa.

7. The method as claimed in claim 5, wherein a partial pressure of the oxidation gas in the processing container in said step (a) is 100 times or more a combined value of a partial pressure of the first gaseous phase material and a partial pressure of the second gaseous phase material in the processing container in said step (b).

8. A computer-readable recording medium storing a program for causing a computer to execute a film formation method by a film formation apparatus including a processing container retaining a silicon substrate therein, an oxidation gas feed part to feed an oxidation gas into the processing container, and a material gas feed part to feed a first gaseous phase material formed of an amidic organic hafnium compound and a second gaseous phase material formed of a silicon-containing material into the processing container, the film formation method comprising the steps of:
    (a) forming a base oxide film on the silicon substrate by feeding the oxidation gas into the processing container and oxidizing a surface of the silicon substrate; and
    (b) forming a metal silicate film on the base oxide film by starting feeding the first gaseous phase material and the second gaseous phase material simultaneously into the processing container while continuing to feed the oxidation gas,
    wherein a partial pressure of the oxidation gas in the processing container is higher in said step (b) than in said step (a).

9. The computer-readable recording medium as claimed in claim 8, wherein the silicon-containing material is an amidic organic silicon compound.

10. The computer-readable recording medium as claimed in claim 9, wherein:
    the amidic organic hafnium compound is tetrakis(diethylamino)hafnium; and
    the amidic organic silicon compound is tetrakis(dimethylamino)silane.

11. The computer-readable recording medium as claimed in claim 10, wherein the oxidation gas comprises oxygen.

12. The computer-readable recording medium as claimed in claim 11, wherein a partial pressure of the oxidation gas in the processing container in said step (a) is higher than or equal to 6.35 Pa.

13. The computer-readable recording medium as claimed in claim 11, wherein a partial pressure of the oxidation gas in the processing container in said step (a) is 100 times or more a combined value of a partial pressure of the first gaseous phase material and a partial pressure of the second gaseous phase material in the processing container in said step (b).

14. A method of forming a metal silicate film on a silicon substrate in a processing container, the method comprising the steps of:
    forming a base oxide film on the silicon substrate by feeding an oxidation gas into the processing container at a first partial pressure; and
    forming the metal silicate film on the base oxide film by continuing to feed the oxidation gas at a second partial pressure higher than the first partial pressure and by feeding a first gaseous phase material formed of an amidic organic hafnium compound and a second gaseous phase material formed of a silicon-containing material into the processing container,
    wherein a lower limit of the first partial pressure is a pressure at which an equivalent oxide thickness of a combination of the base oxide film and the metal silicate film switches from decreasing to increasing on condition that the second partial pressure is equal to the first partial pressure.

15. The method as claimed in claim 2, wherein the plasma processing is performed using a microwave plasma processing apparatus.

16. The method as claimed in claim 2, wherein the plasma processing is adapted to accelerate oxidation of the metal silicate film.

* * * * *